United States Patent [19]

Ameen et al.

[11] Patent Number: 5,057,969
[45] Date of Patent: Oct. 15, 1991

[54] THIN FILM ELECTRONIC DEVICE

[75] Inventors: Joseph G. Ameen, Apalachin; Joseph Funari, Vestal; John A. Goldfuss, Jr., Port Crane, all of N.Y.

[73] Assignee: International Business Machines Corporation, Armonk, N.Y.

[21] Appl. No.: 578,711

[22] Filed: Sep. 7, 1990

[51] Int. Cl.$^5$ .................................................. H05K 7/20
[52] U.S. Cl. ...................... 361/386; 361/398; 361/400; 361/406; 361/408
[58] Field of Search ............... 361/386, 388, 389, 398, 361/400, 401, 405, 406, 408, 413

[56] References Cited

U.S. PATENT DOCUMENTS

| | | | |
|---|---|---|---|
| 3,617,682 | 11/1971 | Hall | 219/85 |
| 3,722,072 | 3/1973 | Beyerlein | 29/471.3 |
| 3,754,698 | 3/1973 | Bachinski et al. | 228/42 |
| 3,868,764 | 3/1975 | Hartleroad et al. | 29/589 |
| 3,868,765 | 3/1975 | Hartleroad et al. | 29/589 |
| 3,871,015 | 3/1975 | Lin et al. | 357/67 |
| 3,912,153 | 10/1975 | Hartleroad et al. | 228/254 |
| 3,937,386 | 2/1976 | Hartleroad et al. | 228/180 |
| 4,295,596 | 10/1981 | Doten et al. | 228/180 |
| 4,373,658 | 2/1983 | March et al. | 228/242 |
| 4,426,571 | 1/1984 | Beck | 219/373 |
| 4,435,740 | 3/1984 | Huckabee et al. | 361/398 |
| 4,545,610 | 10/1985 | Lakritz et al. | 29/589 |
| 4,552,300 | 11/1985 | Zovko et al. | 228/20 |
| 4,564,135 | 1/1986 | Barresi et al. | 228/6.2 |
| 4,587,596 | 5/1986 | Bunnell | 361/398 |
| 4,604,644 | 8/1986 | Beckham et al. | 357/80 |
| 4,605,152 | 8/1986 | Fridman | 228/6.2 |
| 4,646,958 | 3/1987 | Howard, Jr. | 228/123 |
| 4,648,547 | 3/1987 | Mahler et al. | 228/180.1 |
| 4,661,192 | 4/1987 | McShane | 156/292 |
| 4,681,654 | 7/1987 | Clementi et al. | 156/630 |
| 4,720,396 | 1/1988 | Wood | 427/96 |
| 4,752,025 | 7/1988 | Stach et al. | 228/9 |
| 4,789,096 | 12/1988 | Dunn et al. | 228/179 |
| 4,805,827 | 2/1989 | Coffman et al. | 228/20 |
| 4,849,856 | 7/1989 | Funari et al. | 361/386 |
| 4,890,194 | 12/1989 | Derryberry et al. | 361/386 |
| 4,914,551 | 4/1990 | Anschel et al. | 361/389 |
| 4,931,908 | 6/1990 | Boucard et al. | 361/406 |

FOREIGN PATENT DOCUMENTS 0040255 3/1979 Japan.
0085037 6/1980 Japan.

OTHER PUBLICATIONS

AT&T Technical Digest No. 75, 9/84, p. 11.
Hot Air Device for Desoldering IC Chip From A PCB.
IBM TDB, vol. 11, No. 10, 3/69, p. 1298, Solder Reflow Tool.
IBM TDB, vol. 15, No. 3, 8/72, pp. 822, 823 Hot Gas Gun.
IBM TDB, vol. 29, No. 11, 4/87, pp. 4717, 4718, Rework Fixture for Surface Mounted Components.

*Primary Examiner*—Gregory D. Thompson
*Attorney, Agent, or Firm*—Lawrence R. Fraley

[57] ABSTRACT

A thin film electronic package which utilizes a circuitized substrate (e.g., a printed circuit board) having a flexible film carrier electrically coupled thereto. The film carrier includes a dielectric layer (e.g., polyimide) with first and second circuit layers located on opposite sides thereof. These circuit layers are interconnected, electrically, through the dielectric. An electronic device (e.g., semiconductor chip) is electrically connected to bridging portions of the conductive leads of the carrier's first circuit layer, which bridging portions extend across apertures provided within the dielectric. A plurality of solder elements are utilized to provide electrical connection between respective contact locations of the electronic device and respective bridging portions of the first layer's conductive leads.

8 Claims, 4 Drawing Sheets

THIN FILM ELECTRONIC DEVICE

TECHNICAL FIELD

This invention relates to the electronic packages and particularly to electronic packages which utilize thin film circuit members as part thereof. Even more particularly, the invention relates to such structures wherein the thin film members are electrically connected using solder.

CROSS REFERENCE TO FILED APPLICATIONS

In U.S. Pat. Ser. No. (S.N.) 07/198,901, entitled "Flexible Cable For Carrying An Electronic Device" (D. G. McBride et al), filed May 26, 1988, there is described a flexible cable structure having an electronic device (semiconductor chip) electrically connected thereto. The flexible cable is defined as a three-layered structure wherein two conductive layers are located on opposite sides of an interim dielectric layer. U.S. Pat. Ser. No. 07/198,901 is now U.S. Pat. No. 4,937,707.

In U.S. Pat. Ser. No. 07/226,161, entitled "Method And Apparatus For Fluxless Solder Bonding" (H. R. Bickford et al), filed July 29, 1988, there is described an apparatus for performing fluxless solder bonds wherein hot gas is directed onto solder mounds to cause these to become molten and subsequently attach to various lead structures.

Both of the above applications are assigned to the same assignee as the instant invention.

BACKGROUND OF THE INVENTION

Electronic packages which include a thin film circuit member as an integral part thereof are known in the industry, with examples being defined in U.S. Pat. Nos. 4,849,856 (J. Funari et al) and 4,914,551 (M. Anschel et al), both of which are assigned to the same assignee as the instant invention. As mentioned therein, a main objective in the design of such electronic packages is to provide these with as high current densities as possible within a minimum of space. Such miniaturization efforts, while providing several highly advantageous features, also present various engineering problems in both the manufacture and operation of these structures. In the aforementioned U.S. Pat. Nos. 4,849,856 and 4,914,551, for example, solutions to assure effective package heat removal during operation as well as facilitating package assembly are defined.

One particular problem facing designers of electronic packages containing thin film circuit structures is the essential requirement to provide sound electrical connections between the relatively large number of extremely small conductive elements (signal, ground and/or power conductors) and the respective contact locations (e.g., at the semiconductor chip and other circuit locations, such as on a printed circuit board or similar substrate) to which the chip is electrically coupled. As will be defined herein, the present invention defines both such a package and a method of forming such electrical connections in a film member and electronic device for use therein wherein relatively high circuit densities are attained. As will be further defined, such connections and the resulting structure are accomplished using solder. Even more particularly, such connections are achieved without use of chemical flux.

As is known, soldering represents a common technique for joining various objects together, including thin film circuits and other electronic devices. Typically, the conductive portions of these structures (usually metallic, e.g., copper) have been coated with a chemical flux prior to joining. Solid solder is then placed between the flux-coated objects or a flux-filled solder paste is screen-printed onto one of the conductive portions and heated to a molten state such that the molten solder coats the portions of these objects which in turn have been coated with such flux. Thereafter, the molten solder is cooled to form a joint between the two objects.

As is known, the flux serves to chemically reduce oxide which may be on the surface of the metallic objects being joined, and also on the surface of the molten solder. Such oxide prevents solder wetting between these surfaces, resulting in an ineffective bond. Using flux, this material volatilizes and is burned off during the bonding operation, causing certain undesirable effects such as gas generation which in turn can become incorporated within the molten solder. This may further result in voids in the bonding region, which in turn may weaken the final physical joint. Such voids further decrease the cross-sectional area of such a connection, which, if designed for providing electrical interconnection, may thus reduce the conductivity between the two conductors being joined. Still further, flux residue which is not totally volatilized may corrode the resulting solder joints as well as the objects being joined.

In microelectronic applications (e.g., for electronic package structures as defined herein), solder bonds are commonly used. In one technique, an electronic device (semiconductor chip) is mounted onto a packaging substrate (thin film structure) in a "flip-chip" orientation. In this orientation, the surface of the chip having contact locations is placed facing the thin film circuit member. The contact locations on the chip and the respective thin film conductive elements are electrically connected using solder structures, also referred to as controlled collapse chip connections (C4's).

As defined below, the present invention provides a significant improvement over currently known soldering techniques for performing electrical connections in miniaturized electronic packages. The method as defined herein assures sound, effective electrical connections between extremely small circuit elements. The method is relatively safe and can be adapted to mass production techniques, thus reducing the overall cost of the final package structure.

It is believed that an electronic package and method for forming electrical connections between the various elements for use in such a package possessing the advantageous features described herein would constitute a significant advancement in the art.

DISCLOSURE OF THE INVENTION

It is, therefore, a primary object of the present invention to enhance the art of electronic packaging.

It is the further object of the invention to provide a method of forming sound, effective electrical connections between flexible film carriers and an electronic device for eventual use within an electronic package, wherein such connections can be accomplished in a safe and expeditious manner.

It is yet another object of the invention to provide a method as stated above which provides such connections in high circuit density configurations to thus substantially meet the miniaturization demands in today's packaging industry.

In accordance with one aspect of the invention, there is defined a method of forming a plurality of electrical connections between a flexible, thin film carrier and an electronic device wherein the method comprises the steps of providing an electronic device having contact locations thereon, positioning a solder mound on each of these locations, aligning a flexible film carrier with these solder mounds and engaging the film carrier to cause portions of each of the conductive leads which bridge respective apertures within the film carrier's dielectric layer to contact and exert a predetermined force against a respective one of the solder mounds such that each of these leads is bent over said respective solder mound. A hot gas is directed onto each of the conductive leads engaging these solder mounds to heat the leads to a temperature sufficient to cause at least a portion of the contacted solder mounds to become molten. The molten solder mounds are thereafter cooled to form the desired solder bond and thus assure an effective electrical connection.

In accordance with another aspect of this invention, there is defined an electronic package which comprises a circuitized substrate, a flexible film carrier electrically coupled to the substrate and including a dielectric layer having first and second circuit layers located on opposite sides thereof, the first circuit layer including conductive leads which bridge respective apertures within a dielectric layer of the film carrier, and an electronic device which includes a plurality of contact locations thereon each connected to a respective one of the bridging portions of the conductive leads of the first layer. The package further includes a plurality of solder elements, each of which provides the electrical connection between the electronic device's contact locations and the respective bridging conductive leads.

BEST MODE FOR CARRYING OUT THE INVENTION

For a better understanding of the invention, together with other and further objects, advantages and capabilities thereof, reference is made to the following disclosure and appended claims in connecting with the above-described drawings.

In FIGS. 1-6, there are shown the steps of forming a plurality of electrical connections between a flexible film circuit carrier 11 and an electronic device 13 (e.g., semiconductor chip). The resulting subassembly (device-carrier) is to be incorporated within an electronic package such as defined in the aforementioned U.S. Pat. Nos. 4,849,856 and 4,914,551, both of which are incorporated herein by reference. A partial view of such a package is provided in FIG. 7.

Figure 1:
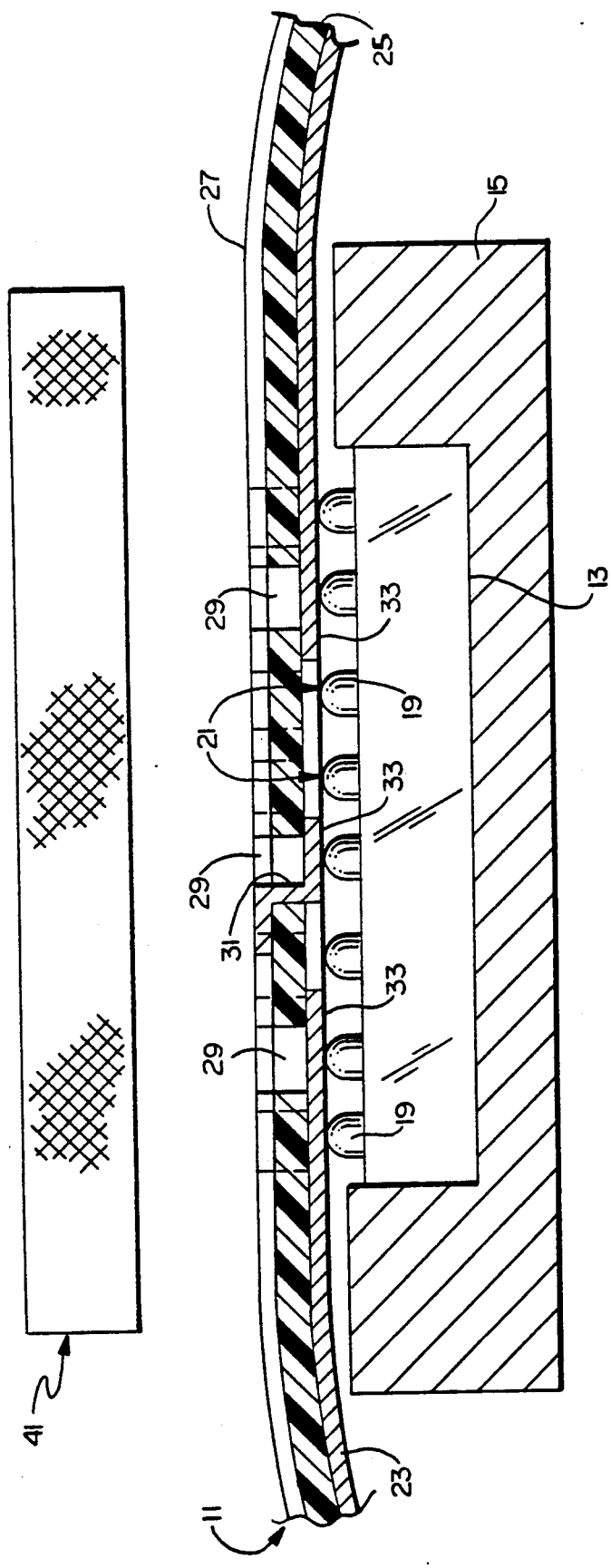
FIGS. 1-6 represent the various steps of forming a plurality of electrical connections between a flexible film carrier and an electronic device in accordance with a preferred embodiment of the invention.

In FIG. 1, device 13 is shown as being positioned within a holder (support) member 15. Although only one such chip is shown in FIG. 1, it is understood that additional such devices can be simultaneously positioned within respective receiving locations (e.g., channels) within holder 15 and treated in a simultaneous manner. Prior to this positioning, selected contact locations (17 in FIG. 2) which form part of the device are provided with individual solder mounds 19. Each mound is of 3:97 tin-lead solder composition, but it is understood that other compositions may be readily used herein. By the term 3:97 tin-lead solder composition is meant to define a solder composition which comprises about 3 percent tin and about 97 percent lead. Such is a standard procedure for defining solder compositions and will be used at other locations herein. Each solder mound is applied using techniques known in the art and further definition is not believed necessary. Significantly, each mound preferably comprises the configuration illustrated in FIGS. 1-3) to include a substantially dome-shaped upper portion 21. This also is not meant to limit the invention in that other configurations are of course acceptable. With the plurality (e.g., from about 250 to 350) of solder mounds joined to the similar number of respective contact locations 17, device 13 is positioned within holder 15. Holder 15 is preferably metallic (e.g., stainless steel). Once so positioned, the holder is preferably heated to a predetermined temperature (e.g., approximately 100 to 150 degrees Celsius (C.). to in turn heat device 13 (to about the same temperature). Such preheating of device 13 is preferred to substantially eliminate subsequent thermal shock to the device 13 resulting from exposure thereof to the hot gas directed toward this portion of the structure, as will be further described hereinbelow.

Flexible film carrier 11 includes a first circuit layer 23, which, in the orientation depicted in FIGS. 1-6, is shown as located at the bottom portion of the carrier and facing device 13. Eventually, carrier 11 and the secured device 13 will be inverted so as to assume the position represented in FIG. 7. By the term carrier as used herein is meant to define a thin film circuitized member designed for having at least one electronic device of the type defined herein electrically coupled thereto. Carrier 11 further includes a central dielectric layer 25 (e.g., polyimide) which includes first conductive layer 23 located thereon. Layer 23 is preferably of copper or copper-chromium composition and may be applied to the dielectric layer in a manner known in the art. Such description thereof is thus not believed necessary. In One example, first circuit layer 23 possessed an overall thickness Within the range of from about 0.0011 inch to about 0.0017 inch. The corresponding dielectric layer 25 possessed a thickness within the range of from about 0.0018 inch to about 0.0022 inch. Positioned on the opposite side of dielectric layer 25 from the first layer 23 is a second conductive layer 27, which layer 27 is also preferably of a copper or copper-chromium composition. This layer may also be adhered to the dielectric material 25 using known techniques, and preferably possesses a thickness within the range of about 0.0011 inch to about 0.0018 inch.

By the term layer as used herein is meant to include a substantially solid (continuous) structure as well as a structure comprised of several individual lines spacedly located on the dielectric in accordance with a predetermined, planar pattern. Thus, a layer as defined herein may perform signal, power or ground functions, depending on the desired operational characteristics of the package.

Film carrier 11 includes a plurality of apertures 29 formed at predetermined locations within dielectric layer 25. These apertures, as shown, extend through the entire thickness of layer 25. In a preferred embodiment of the invention, a total of 344 such apertures were provided within a flexible film carrier having an overall thickness of about 0.002 inch and a contact area location (that location which is designed for being electrically connected, through the bonding method defined herein, to the pattern of contact locations 17 formed within/upon device 13) of about 0.0027 square inches. Apertures 29 are formed within dielectric layer 25 so as to enable passage of hot gas through the flexible film carrier to accomplish the unique solder connections defined hereinbelow. As further shown in FIGS. 2–6, portions of the conductive circuit layer 23 extend across (bridge) at least one of these apertures, said portions subsequently being physically connected to one of the respective solder mounds 19. It is also within the scope of the invention to utilize apertures such as those represented by the numerals 29 to provide selected paths for interconnections between the opposed circuit layers 23 and 27. For example, it may be desirable to electrically connect selected ones of individual circuit lines within first circuit layer 23 to a substantially solid second layer 27, which second layer may serve as an electrical ground in the final package. Such an interconnection is represented by the numeral 31 in FIG. 1, and also represented by the conductive element 33 to the left in FIGS. 2-5.

In a preferred embodiment of the invention, first layer 23 represents a signal layer and thus includes a plurality of individual conductive leads 33 spacedly positioned on dielectric 25 in a predetermined pattern. See particularly FIG. 6, in comparison to FIG. 5. Understandably, these signal leads 33 correspond to the pattern of solder mounds (and thus contact locations) on device 13. Such signal lines may, as illustrated, terminate in the contact region with device 13 and extend substantially outwardly therefrom (e.g., the longer signal lines extending to the left and right in FIG. 1). Understandably, the configuration depicted in FIG. 1 is not meant to limit the invention in that several others may be readily utilized for carrier 11.

Carrier 11 is aligned strategically over device 13 such that the described bridging conductors are each precisely aligned with the designated, respective solder mound to which it will be connected. Such alignment is achieved using a precision camera technique to assure the accuracy required. A screen member 41 is then lowered to engage the uppermost surface of second layer 27. By the term screen member as used herein is meant to define any structure which may provide positive engagement with carrier 11 and which also permits passage of desired hot gasses (defined below) therethrough. In one example of the invention, screen member 41 was comprised of stainless steel mesh screening and possessed a thickness within the range of from about 0.03 inch to about 0.06 inch. Such a member may also be comprised of sintered metal (e.g., stainless steel) which metal, due to this internal structure, enables passage of hot gas therethrough.

Figure 2:
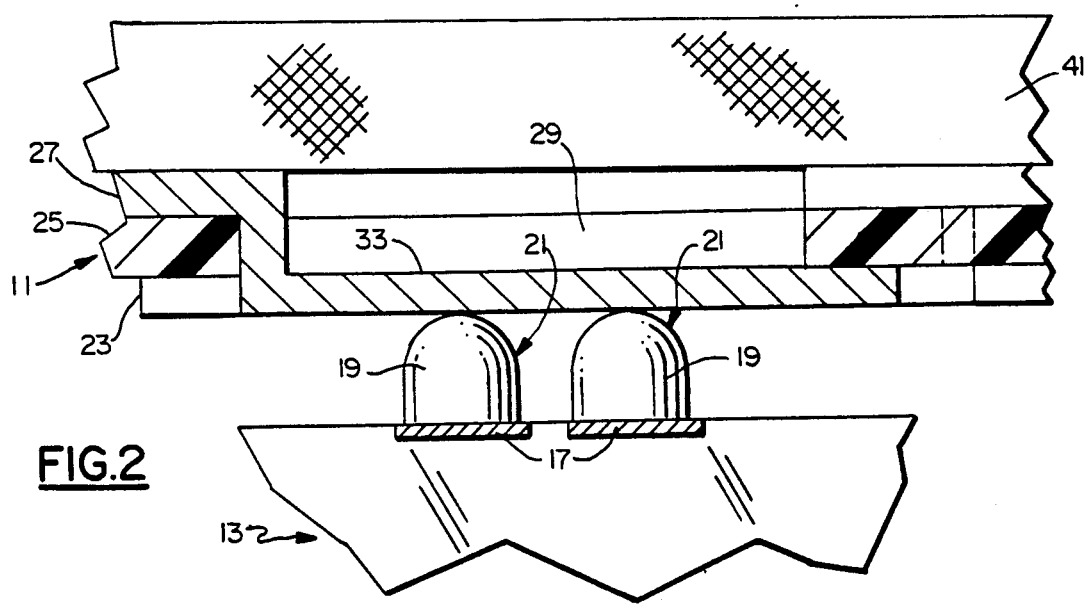

In FIG. 2, screen 41 is shown as engaging carrier 11 to cause it to be downwardly moved so as to physically contact solder mounds 19. Screen 41 preferably applies sufficient downward force on carrier 11 such that a total force within the range of from about 3 grams to about 10 grams is applied by the individual, bridging conductive leads 33 on each solder mound. In comparing FIGS. 2 and 3, it is understood that two such leads 33 are shown, one behind the other, such that each physically contacts a respective one of the solder mounds 19. In further comparing these FIGS. to FIG. 6, it can be seen that more than two such leads may be located across aperture 29 within carrier 11. Accordingly, it is not necessary in the invention that each individual lead bridge a singular respective aperture. In FIGS. 2-5, it is understood that the conductive lead 33 located nearest the viewer, and shown in section, physically contacts the solder mound 19 to the left. Accordingly, the remaining lead 33 shown in these drawings as behind the sectioned lead 33 physically contacts the solder mound 19 to the right. And, as stated, the lead shown in section is electrically connected to second layer 27 through aperture 29 in this example of the invention. Said lead may also, of course, extend outwardly along layer 23 as indicated in FIG. 1.

Figure 3:
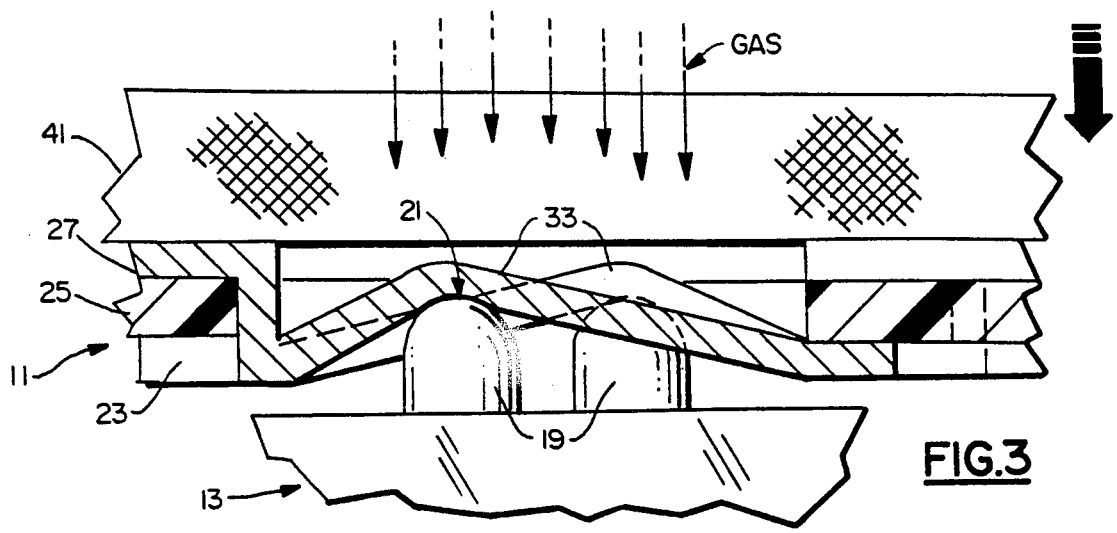

With the aforedefined force applied by leads 33 on the respective solder balls 19, hot gas is passed through screen 41 and through apertures 29 to pass directly onto the bridging portions of each lead 33. As shown in FIG. 3, the force applied has caused these bridging portions to be bent over their respective solder mounds. Preferably, the aforementioned application of force and passage of hot gas occurs simultaneously. A preferred hot gas for use in the invention is nitrogen, although it is understood that others, including argon and hydrogen, may also be used. Nitrogen is preferred because of its more ready availability, reduced cost, etc. Hot gasses such as nitrogen and argon are also more preferred for safety reasons. It is also possible in the invention to utilize gases comprised of various combinations of these elements, including a gas comprised of about 10% hydrogen, 80% nitrogen and other selected ingredients.

The hot gas is preferably applied at the temperature within the range of from about 400 degrees C. to about 500 degrees C. when directed onto leads 33. As a result, leads 33 are heated to a temperature within a range from about 350 degrees C. to about 400 degrees C., sufficiently to cause the physically contacted, upper dome-shaped portions of each solder mound to become substantially molten. The described 3:97 tin-lead solder has a melting temperature of about 318 degrees C., such that it readily becomes molten when so engaged by the heated leads. The hot gas is applied for only about 0.2 seconds to about 2.0 seconds, depending on the number of leads, solder mounds, material thicknesses, etc.

It is also understood that, with reference to the embodiment of the invention as depicted in FIGS. 2-5, part of the hot gas also directly contacts the several solder mounds (as well as the bridging leads engaging said mounds). Thus, the gas also provides some direct heating of the mounds to even further facilitate rapid heating thereof to attain the desired molten state.

Figure 4:
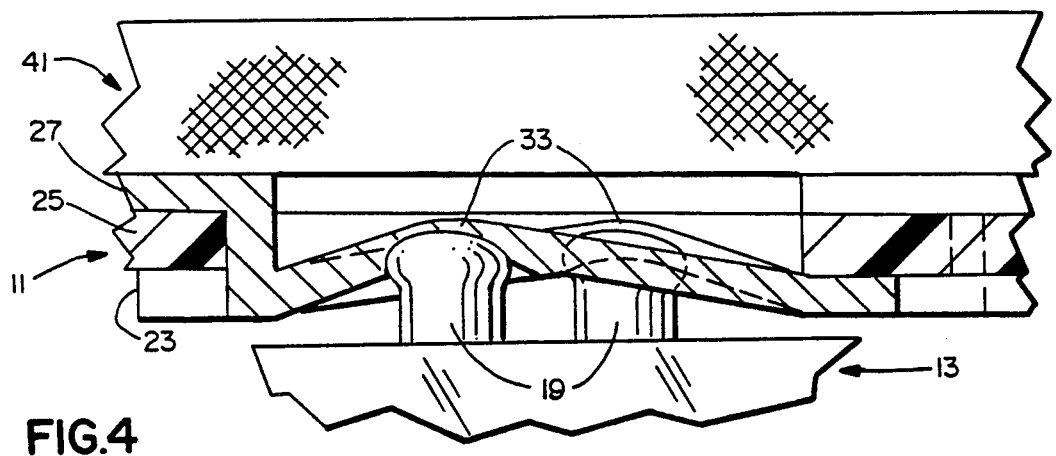
Figure 5:
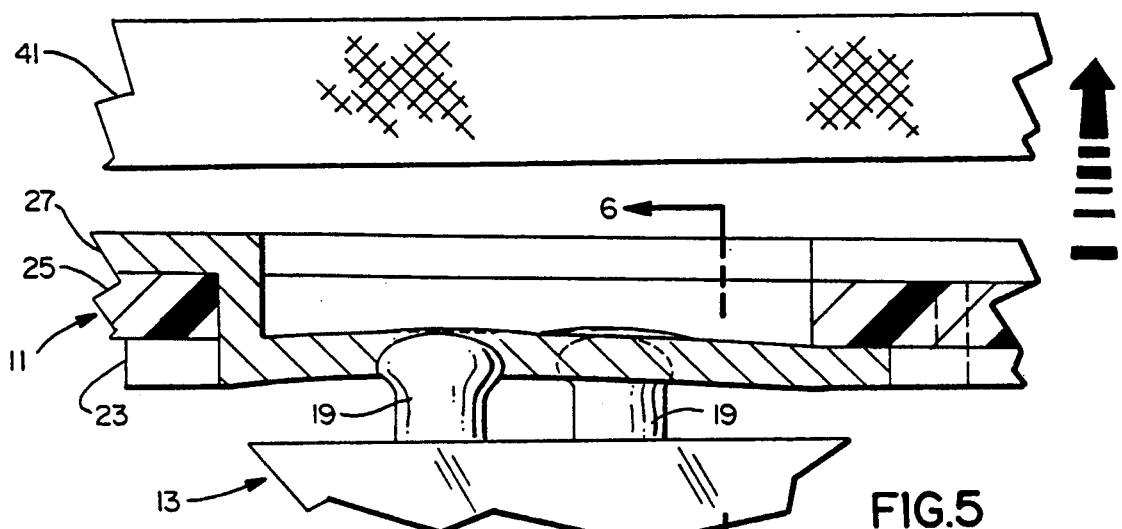
Figure 6:
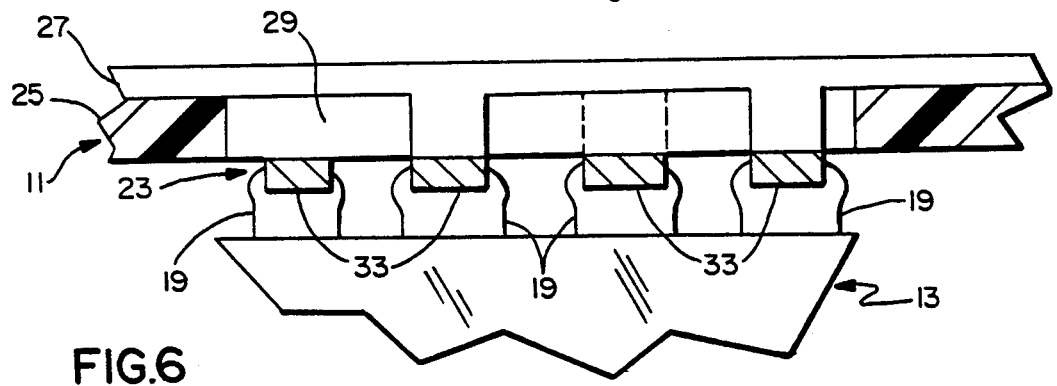

In FIG. 4, the upper portions of each solder mound are shown as being melted to move substantially upwardly along the outer sides of the respective conductive leads. Such side movement is also represented in FIG. 6, said view taken along the line 6—6 in FIG. 5. Significantly, this melting, in combination with the downward force and hot gas application, results in a reduction in the total bend of each lead, as shown in FIG. 4. Each lead 33 thus substantially becomes straightened to substantially resume its original position prior to solder mound engagement. This final lead configuration is best depicted in FIG. 5. As further shown in FIG. 5, screen 41 has been withdrawn. Prior to such upward movement of screen 41, however, cooling gas (e.g., nitrogen) is directed onto the solder mounds and contacting lead structures to facilitate cooling thereof and final solder connection. This gas is preferably introduced at room temperature and for a relatively brief period of time (e.g., from only about 0.3 seconds to about 4.0 seconds). Subsequently, screen 41 is raised.

Preferably, the portions of conductive leads 33 which physically contact the respective solder mounds 19 each include a very thin layer (e.g., 0.00002 inch) of nickel having thereon another very thin layer (e.g., 0.00002 inch) of highly conductive, precious metal (e.g., gold). During formation of the respective solder bonds, the tin portion of the solder mound combines with the thin gold to form a tin-gold alloy at a specified temperature (e.g., 280 degrees C.). This results in formation of a liquid pool, causing the lead within the solder to also liquify, forming a singular alloy. As shown and described, preferably only the upper portion of each solder mound becomes molten to form the described bond with the respective lead 33.

Thus, a solder connection is formed between individual pairs of conductive leads and chip contact locations in a facile, effective manner. Connections were possible using the teachings of the invention between leads and contacts of extremely small sizes. In one example, conductive leads having a total width of only about 0.0022 inch and spaced apart only about 0.0026 inch were successfully bonded to chip contact locations. By way of further example, such a chip contact area possessed dimensions of only about 0.002 inch by about 0.004 inch and included therein a total of 344 such contact locations.

Figure 7:
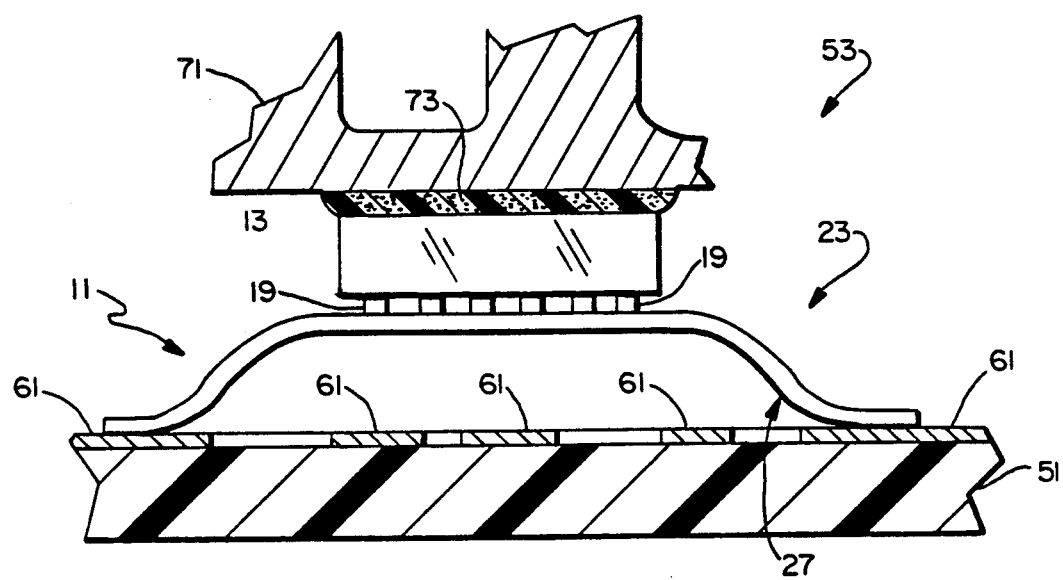
FIG. 7 illustrates an electronic package as may be formed using the method illustrated in FIGS. 1-6, with additional structure (e.g., a heat sink member) forming part thereof.

In FIG. 7, the flexible film carrier 11 as solder bonded to device 13 in the manner defined above is electrically connected to a circuitized substrate (e.g., printed circuit board) 51 to form part of an electronic package 53. Carrier 11 is illustratively represented in FIG. 7 as a single layer structure, but it is of course understood that this member comprises the aforedefined three individual layers described in FIGS. 1-6. Carrier 11 and device 13, as bonded, have been inverted relative to the orientation depicted in FIG. 1 prior to connection to the contact sites (circuitry) 61 on substrate 51. Thus, the preferred signal layer 23 (FIG. 1) is located on the upward side of carrier 11 in FIG. 7. In such an arrangement, it is preferred that the outer contact end portions for the leads which form the circuitry in the first layer 23 be electrically coupled to respective contact sites 61 (FIGS. 8-10) formed as part of substrate 51 (e.g., on the upper surface thereof). It is also possible in the embodiment of FIG. 7 to extend the second circuit layer 27 substantially to the outermost end locations of carrier 11 and to also connect selected portions of this layer to respective contact sites 61. Further, it is within the scope of the invention to extend the second layer (e.g., if used as a ground layer) to only the portion of carrier 11 substantially opposite that of device 13 to electrically connect one or more parts of this ground layer to one or more conductive lines which form part of the first layer 23, to thus provide a ground connection to respective circuitry within substrate 51 on the same side of carrier 11 as first layer 23. Further combinations are also within the scope of the invention and further definition is not believed necessary.

Figure 8:
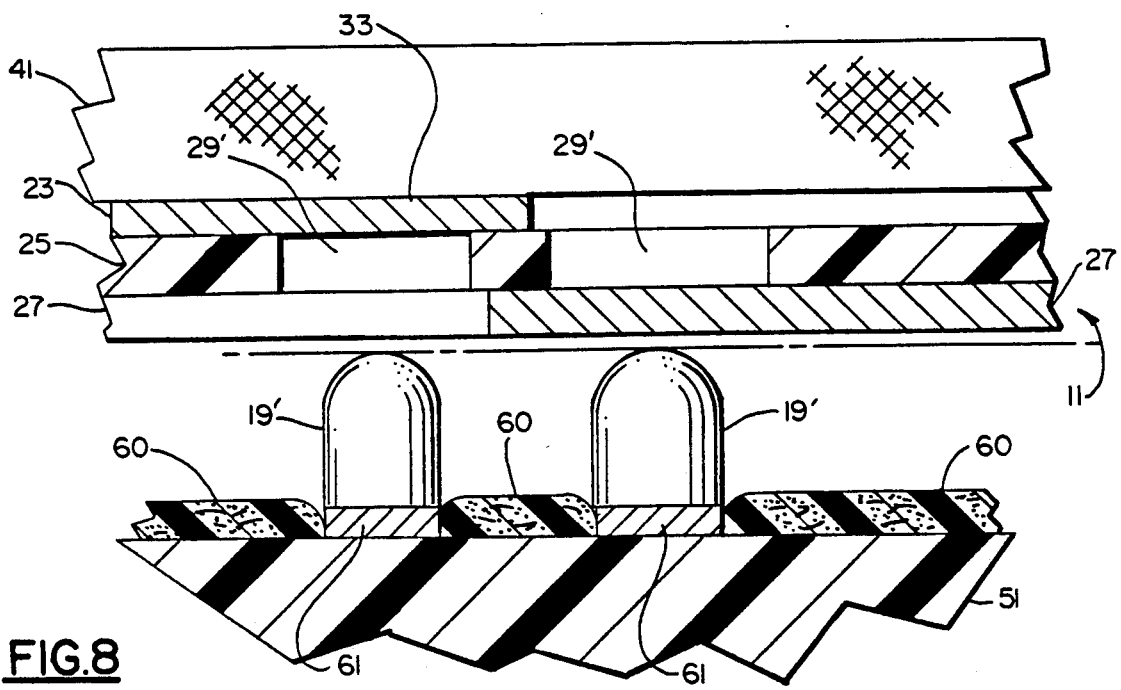
FIGS. 8-10 illustrate the steps in a method for forming electrical connections between a flexible film carrier and a circuitized substrate (e.g., a printed circuit board) to which the flexible film carrier may also be electrically coupled.
Figure 9:
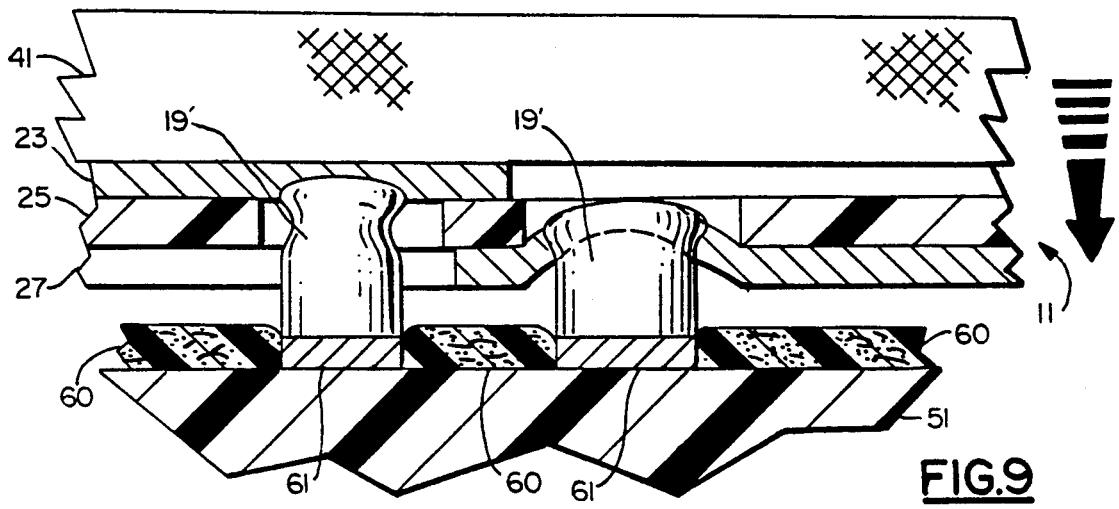
Figure 10:
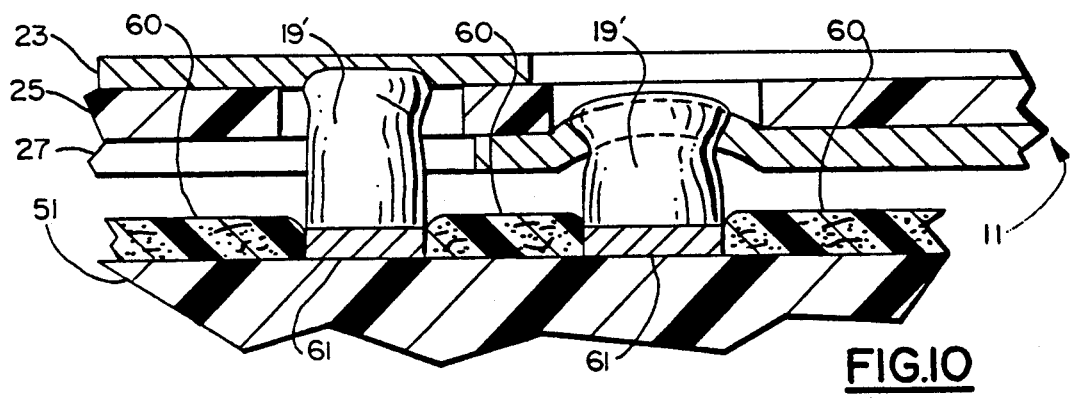

In FIGS. 8-10, a preferred method for providing electrical connections between the respective contact sites 61 on substrate 51 and various conductive leads extending to the outer portions of carrier 11 is shown. In FIG. 8, the second layer 27 is shown as extending from the right and across an aperture 29' within the carrier's dielectric layer 25. Another aperture 29' is also formed within layer 25 and includes a bridging portion of a conductive lead 33 extending thereacross. In the embodiment of FIG. 7, screen 41 is lowered to engage carrier 11 to cause downward movement thereof and engagement with the solder elements 19'. Elements 19' are preferably of 60:40 tin-lead solder and preferably slightly larger than the corresponding solder elements 19 in FIGS. 1-6. As shown in FIG. 7, each solder element possesses a substantially uniform height but this is not meant to limit the invention as acceptable tolerances are permitted when using the teachings of this invention. Such tolerances are also acceptable in the formation of the inner lead structures (FIGS. 1-6) described above and such method thus readily compensates for varying solder mound heights to thereby represent a significant feature of the invention. That is, the aforementioned bending of the respective conductive leads assures sufficient tolerancing to compensate for varying solder mound heights while assuring effective contact with all solder mounds.

In FIG. 9, the extending lead of second layer 27 has been bent sufficiently as a result of the force applied by screen 41 (which may be similar to that applied in FIGS. 1-6). Significantly, the bridging portion of lead 33 in first layer 23, located a distance above the second layer lead (the thickness of dielectric layer 25) does not bend during this outer lead connection. Hot gas is still directed through screen 41 onto this lead 33, however, as it is through aperture 29' onto solder element 19' which eventually bonds to the second layer lead. Thus, each heated, bridging lead causes subsequent heating of the respective solder element to cause partial melting thereof and an effective solder bond. Such a final structure is depicted in FIG. 10, wherein screen 41 (not shown) has been removed.

As a further step in the invention, it is also preferred to apply epoxy 60 on the upper surface of substrate 51 to substantially surround each of the respective contact sites 61. Preferably, contact sites 61 are of copper and have a thickness of only about 0.004 inch.

With carrier 11 electrically connected to both device 13 and substrate 51, the device is then preferably thermally coupled to a heat sink 71. Preferably, this is accomplished using an epoxy 73 of the type defined in U.S. Pat. No. 4,849,856 ("Scotchcast", including a zinc oxide thermally conductive filler). Other epoxies are readily possible for use in the invention and the invention is thus not limited to this particular type. A similar epoxy is also used for the epoxy located on the upper surface of substrate 51. Heat sink member 71 may be of the same material and configuration depicted in U.S. Pat. Nos. 4,849,856 and 4,914,551, and further description is not believed necessary. Other configurations are readily possible.

Although the aforementioned method as defined illustrates the bridging of individual conductive leads across selected apertures and the passage of hot gas therethrough so as to heat these leads to subsequently cause heating above the contacted solder mounds, it is understood that additional connections may be formed using the teachings of the invention wherein non-bridging types of lead portions neighboring (adjacent) those directly receiving not gas are also heated while engaging respective solder mounds. That is, it is within the scope of the invention to provide such additional connections by passage of such hot gas through the already provided apertures, which hot gas may further pass onto such additional, neighboring lead structures located in the vicinity of such apertures (but not extending thereacross) to sufficiently heat these leads and cause active solder bonding. Thus, each such non-bridging lead, if appropriately positioned relative to apertures within carrier 11, may receive sufficient heat from hot gas passing through these apertures so as to cause the solder contacted therewith to become molten as occurred with those solder elements shown in the drawings as directly contacting bridging leads. Thus, a combination of solder connections between bridging and non-bridging leads is possible using the unique teachings of the instant invention.

As yet another step, an encapsulant material (e.g., having a low coefficient of thermal expansion) is preferably used to substantially encapsulate the formed solder connections on device 13. Such an encapsulant, which may be chosen from encapsulants known in the art, has proven to provide additional mechanical connection support, particularly during subsequent thermal and life testing, of such solder connections.

Thus there has been shown and described a method of making sound electrical connections between a flexible film carrier and an electronic device, which carrier and device are to be used within an electronic package assembly. The method as defined herein can be accomplished in a safe, facile manner and is readily adaptable to mass production. The package as produced using this method thus possesses relatively high circuit densities as is highly desired in today's industry.

While there have been shown and described what are at present considered the preferred embodiments of the invention, it will be understood to those skilled in the art that various changes and modifications may be made therein without departing from the scope of the invention as defined by the appended claims.

What is claimed is:

1. An electronic package comprising:
   a circuitized substrate;
   a flexible film carrier electrically coupled to said substrate and including a dielectric layer having a first plurality of apertures therein, a first circuit layer located on one side of said dielectric layer and a second circuit layer located on a second side of said dielectric layer opposite said first side and electrically connected to said first layer at selected locations through said dielectric layer, said first circuit layer including a first plurality of conductive leads each having a portion thereof bridging a respective one of said apertures within said dielectric layer;
   an electronic device including a plurality of contact locations thereon electrically connected to respective ones of said portions of said conductive leads of said first circuit layer which bridge said apertures within said dielectric layer; and
   a plurality of solder elements, each of said elements providing electrical connection between said contact locations of said electronic device and said respective ones of said portions of said conductive leads of said first circuit layer which bridge said apertures within said dielectric layer.

2. The electronic package according to claim 1 wherein said circuitized substrate comprises a printed circuit board having a plurality of contact sites thereon, said flexible film carrier being electrically connected to said contact sites.

3. The electronic package according to claim 2 wherein said dielectric layer further includes a second plurality of apertures therein and said first circuit layer further includes a second plurality of conductive leads each having a portion thereof bridging a respective one of said apertures of said second plurality of apertures, and a second plurality of solder elements, each of said elements of said second plurality providing electrical connection between a respective one of said contact sites and a respective one of said portions of said conductive leads of said second plurality of leads which bridge said apertures of said second plurality of apertures.

4. The electronic package according to claim 1 wherein said dielectric layer is comprised of polymide.

5. The electronic package according to claim 4 wherein said first and said second circuit layers are each comprised of chromium and copper.

6. The electronic package according to claim 1 wherein each of said solder elements of said first and second pluralities of solder elements is comprised of tin and lead.

7. The electronic package according to claim 6 wherein said solder elements of said first plurality are each comprised of 3:97 tin-lead solder and said solder elements of said second plurality are each comprised of 60:40 tin-lead solder.

8. The electronic package according to claim 1 further including a heat sink member, said electronic device thermally coupled to said heat sink member.

* * * * *